United States Patent
Sutskover et al.

(10) Patent No.: US 9,813,190 B1
(45) Date of Patent: Nov. 7, 2017

(54) PRE-DISTORTION CALIBRATION

(71) Applicant: Intel IP Corporation, Santa Clara, CA (US)

(72) Inventors: Ilan Sutskover, Hadera (IL); Roy Nahum, Beer Sheva (IL); Yuval Dafna, Raanana (IL); Ran Shimon, Ramar Gan (IL); Tzahi Weisman, Mevaseret Tzion (IL); Roy Amel, Haifa (IL)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/200,924

(22) Filed: Jul. 1, 2016

(51) Int. Cl.
| | |
|---|---|
| *H03H 7/40* | (2006.01) |
| *H04L 1/00* | (2006.01) |
| *H04L 12/26* | (2006.01) |
| *H04L 25/03* | (2006.01) |
| *H04L 12/741* | (2013.01) |
| *H04L 7/00* | (2006.01) |
| *H04L 27/26* | (2006.01) |

(52) U.S. Cl.
CPC .......... *H04L 1/0042* (2013.01); *H04L 7/0008* (2013.01); *H04L 25/03847* (2013.01); *H04L 27/265* (2013.01); *H04L 43/028* (2013.01); *H04L 45/745* (2013.01)

(58) Field of Classification Search
CPC ........ H03F 1/3247; H03F 3/24; H03F 1/3258; H03F 2201/3224; H03F 2200/453; H03F 1/3229; H04L 27/368; H04B 10/564; H04B 10/58; H04B 1/62
See application file for complete search history.

(56) References Cited

U.S. PATENT DOCUMENTS

| | | | | |
|---|---|---|---|---|
| 2003/0179831 | A1* | 9/2003 | Gupta | H03F 1/3247 375/296 |
| 2004/0232984 | A1* | 11/2004 | Meade | H03F 1/3247 330/149 |
| 2005/0190857 | A1* | 9/2005 | Braithwaite | H03F 1/3247 375/296 |
| 2009/0256630 | A1* | 10/2009 | Brobston | H03F 1/3247 330/2 |
| 2013/0120062 | A1* | 5/2013 | Lozhkin | H03F 1/3247 330/149 |
| 2014/0241461 | A1* | 8/2014 | Kim | H04B 1/0475 375/297 |
| 2014/0266431 | A1* | 9/2014 | Chen | H03F 1/3247 330/149 |

* cited by examiner

*Primary Examiner* — Khanh C Tran
(74) *Attorney, Agent, or Firm* — Schiff Hardin LLP

(57) ABSTRACT

Described herein are technologies related to an implementation of a closed-loop system to measure and compensate non-linearity in a transceiver circuitry of a device.

23 Claims, 4 Drawing Sheets

PRE-DISTORTION CALIBRATION

BACKGROUND

An increasing number of wireless communication standards and a trend towards ever smaller, slimmer and lighter devices may cause design challenges for a device's transceiver circuitry. The design challenges may relate to reduction of noise, jitters, etc. during receiving or transmitting operations.

A closed-loop system may be used to reduce the noise, jitters, etc. The closed-loop system may employ a loopback signal that may be taken from an output of a power amplifier (PA) in order to control transmission that may be required in wireless platforms using on-line rather than production line calibrations.

The implementations described herein address the measurement and compensation of non-linearity in the transceiver circuitry.

DETAILED DESCRIPTION

Described herein is a technology for implementing a closed-loop system configured to measure and compensate for non-linearity in a transceiver circuitry of a device.

For example, a linear transfer function of the closed-loop system is first estimated, for example, during an initial low transmit-power data packet transmission (low transmit-power mode) when the transmission is low enough so that only a linear response is captured. With low transmit power, the power amplifier response is relatively linear. A compensation filter, which may be a real or complex filter, is configured so that the filter emulates the linear transfer function of the loopback signal. When an output of the real loopback signal and of the compensation filter output filter are observed, there is essentially only the nonlinearity of a power amplifier that distinguishes between the two signals.

At a subsequent time instant, a measurement and correction/synchronization of instantaneous changes in gain, phase, and/or delay of a data packet is performed, for example, through a synchronization block. After the correction of the instantaneous changes of the data packet by the synchronization block, a Power Amplifier Pre-Distortion (PAPD) analyzer of the closed-loop system may be configured to compare a baseband signal of a loopback signal and an original baseband signal of a reference transmit signal. The loopback signal as described herein may include the signal that is sampled from an output of a transmit chain and passes through a receive chain. The reference transmit signal is also the input signal.

After the comparison by the PAPD analyzer, firmware from a post-processing block reads the comparison results from the PAPD analyzer and sets a PAPD Look-Up Table (LUT) to perform pre-distortion corrections on subsequent data packets to be transmitted. The firmware, for example, may generate a control signal for the PAPD LUT to perform the pre-distortion corrections.

As described herein, an echo cancellation may be further implemented prior to, or during the emulation of the linear transfer function by the compensation filter. For example, prior to the emulation of the linear transfer function, the compensation filter may be further configured to initially perform echo cancellation in order to minimize and/or cancel signal leakages from an input side of the transmit chain to the loopback signal. In another example, the emulation of the linear transfer function may include the echo cancellation.

Figure 1:
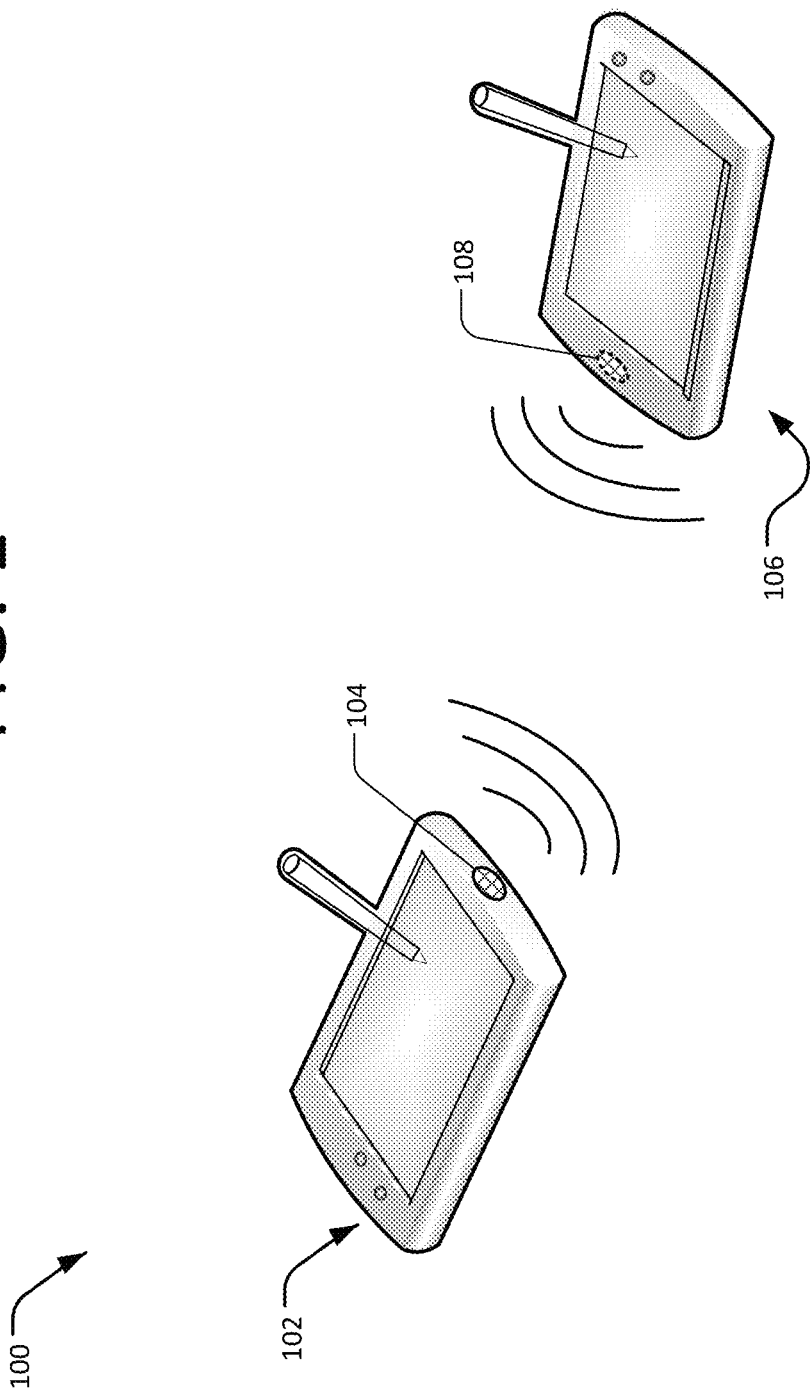
FIG. 1 illustrates a perspective diagram of a communication system in accordance with an aspect of the disclosure.

FIG. 1 illustrates a perspective diagram of a communication system 100 in accordance with an aspect of the disclosure. The system 100 comprises a device 102 with an antenna 104, and another device 106 with an antenna 108.

The devices 102 or 106 may include, but is not limited to, non-portable devices such as an access point (AP), non-portable computers, and the like; and portable devices such as a tablet computer, a netbook, a notebook computer, a laptop computer, mobile phone, a cellular phone, a smartphone, a personal digital assistant, a multimedia playback device, a digital music player, a digital video player, a navigational device, a digital camera, and the like.

The device 102, for example, may communicate with the other device 106 in a network environment. The network environment, for example, includes a cellular base station configured to facilitate communications between the device 102 and the other device 106. In another example, the device 102 communicates with the access point (AP), or vice-versa, using for example, wireless fidelity (Wi-Fi) orthogonal frequency division multiplexing (OFDM) data packets, or other kinds of modulation technique(s). In both of these examples, a non-linearity detection, measurement, and compensation as described in present implementations herein may be applied by the device 102 or 106.

For example, a reference transmit signal is initially transmitted at low power to obtain linear state or linear transfer function of the transceiver circuitry (not shown) of the device 102. At this condition, the linear transfer function of the transceiver circuitry is estimated to set coefficients of a compensation filter (not shown) in the transceiver circuitry.

At another time instant (i.e., after the estimation of the linear transfer function), the synchronization block ensures that the loopback signal and the reference transmit signal match in gain, phase, and/or delay. The change in gain, phase and/or delay may be applied to the loopback signal or the reference transmit signal. However, the estimation of the loopback signal linear transfer function is performed on the reference transmit signal and not the loopback signal; otherwise, the loopback channel would need to be inverted.

With the estimated linear transfer function, and corrected instantaneous changes in the gain, phase, and/or delay of the data packets, a PAPD analyzer (not shown) in the device 102 or 106 may be configured to measure non-linearity from the loopback signal by comparing a loopback baseband signal with a baseband signal of the reference transmit signal. Thereafter, the PAPD analyzer may return either the non-linearity or the look-up table (LUT) of the non-linearity. In the case the PAPD analyzer returns the non-linearity, some other entity (e.g., firmware or digital signal processor) may be required to perform calculations to deduce the pre-distortion tables associated therewith.

In other implementations, an initial echo cancellation may be performed at the transceiver circuitry in order to minimize and/or cancel signal leakages. For example, the estimation of the linear transfer function of the transceiver circuitry may further include the cancellation of the signal leakages. In this example, the echo cancellation may be implemented during the initial calibration process i.e., prior to estimation of the linear transfer function of the loopback signal.

Figure 2:
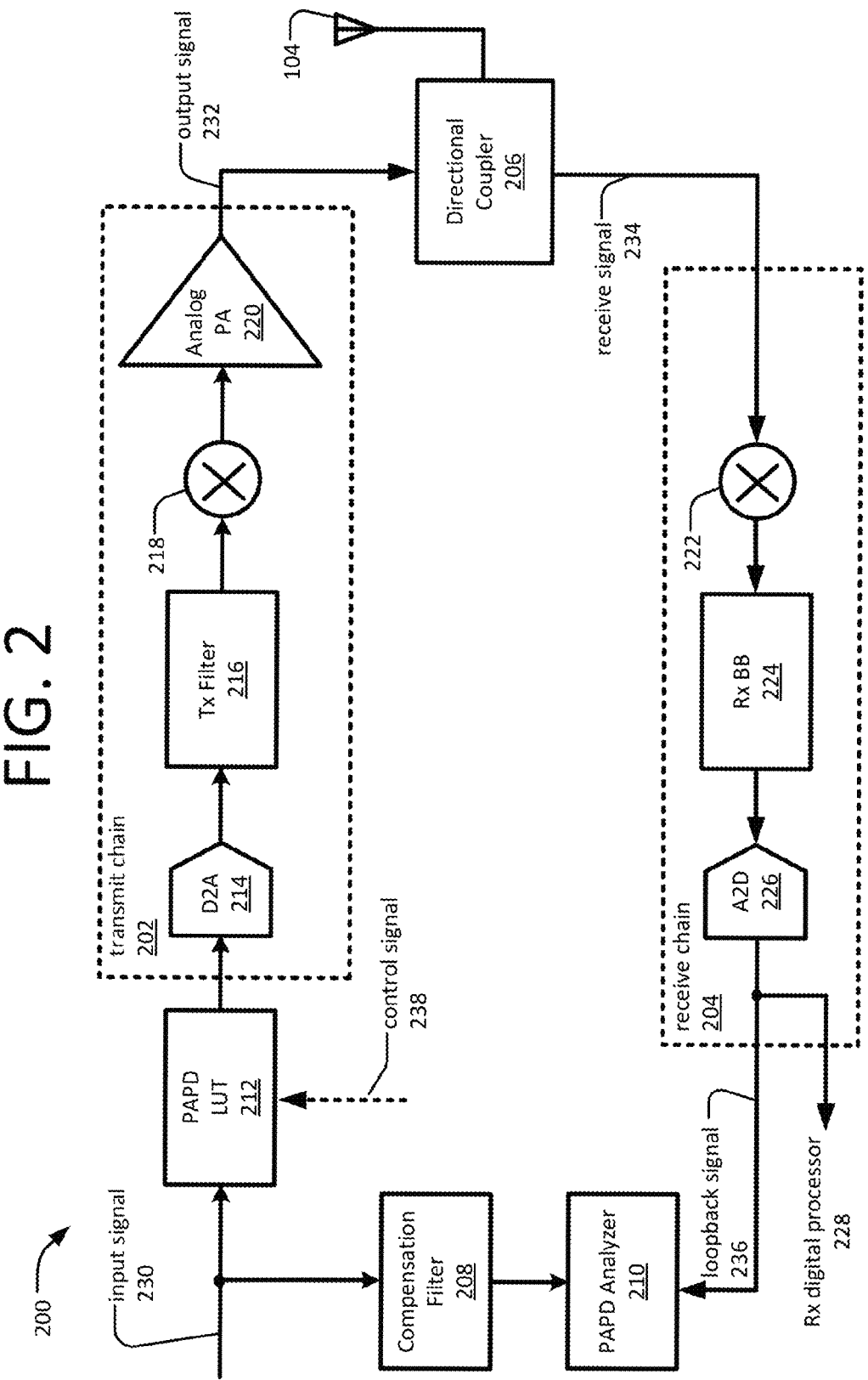
FIG. 2 illustrates a schematic diagram of a closed-loop system configured to measure and compensate non-linearity in a transceiver circuitry of a device in accordance with an aspect of the disclosure.

The example arrangement 100 illustrates in a limited manner basic components of wired/wireless communications between the devices 102 and 106, other components such as battery, one or more processors, SIM card, etc. were not described in order to simplify the embodiments described herein FIG. 2 illustrates a schematic diagram of a closed-loop system 200 configured to implement measurement and compensation of transmission non-linearity in the transceiver circuitry of the device 102 in accordance with an aspect of the disclosure.

As shown, the system 200 includes a transmit chain 202, a receive chain 204, an optional directional coupler 206, a compensation filter 208, a PAPD analyzer 210, and a power amplifier pre-distortion (PAPD) look-up table (LUT) 212 (also known as a Digital Pre-Distortion (DPD) LUT). The transmit chain 202 may further include, but not be limited to, a digital-to-analog converter (D2A) 214, a transmit (Tx) filter 216, a transmitter mixer 218, and an analog power amplifier (PA) 220. The receive chain 204 may further include, but not be limited to, receiver mixer 222, a receiver baseband filter 224, an analog-to-digital converter (A2D) 226 and a receiver digital processor 228. The receiver baseband filter 224 is configured to downconvert a radio frequency or intermediate frequency to baseband.

The apparatus 200 further shows an input signal 230 that may represent an original signal to be transmitted or is referred to herein as the reference transmit signal; an output signal 232 that may represent an output of the transmit chain 202 or the analog PA 220; a receive signal 234 that may represent a sampled transmit signal from the optional directional coupler 206 or a large attenuator; a loopback signal 236 that may include a loopback baseband signal with a non-linearity that is analyzed by the PAPD analyzer 210; and a control signal 238 that is generated by a firmware based on non-linearity analysis from the PAPD analyzer 210. The control signal 238, for example, is used to set up parameters of the PAPD LUT 212 in order to correct the non-linearity in the loopback baseband signal or the loopback signal 236. In this example, a reading of non-linearity analysis and setting up of the PAPD LUT 212 by the firmware may be implemented offline.

As a general overview of the apparatus 200 operation, the input signal 230 may be first transmitted at a low transmit-power mode i.e., the firmware facilitates transmit power-adjustment of the input signal 230 (or the reference transmit signal). The low transmit-power mode is not limited to the transmit power-adjustment from a Digital Signal Processor (DSP) or modem (not shown), but may also include power-gain adjustment of the analog PA 220, power adjustment of a configurable baseband amplifier (not shown) that may be disposed between the D2A 214 and mixer 218, and the like. Obtaining good linearity may be accomplished by reducing power of the input signal 230, preferably before it is amplified.

In an implementation, the compensation filter 208 may be disposed at the transmit side between an input side of the PAPD LUT 212 and the PAPD analyzer 210, while the measurements and corrections of the instantaneous changes on the data packet of the reference transmit signal may be implemented at the loopback signal side e.g., at the receive chain side. In other implementations, the compensation filter 208 may become an equalizer filter implemented at the loopback signal side, while the measurements and corrections of the instantaneous changes on the data packet of the reference transmit signal may be implemented at the transmit side. Alternatively, the compensation filter 208 and the measurements and corrections of the instantaneous changes on the data packet of the reference transmit signal may both be implemented at either the transmit side or the loopback signal side, e.g., at the receive chain side.

At the low transmit-power mode, the combined linear transfer functions of the transmit chain 202 and the loopback receive chain 204 is estimated and the coefficients of the compensation filter 208, which may be a Finite Impulse Response (FIR) filter are changed accordingly. The coefficients are complex, where real filters are a special case of complex filters. Furthermore, a synchronization block 304, as further discussed below with respect to FIG. 3, may measure and correct instantaneous changes in data packets of the reference transmit signal (or alternatively, the loopback signal).

At the low transmit-power mode, the coefficients of the compensation filter 208 are trained to match linear portions at an input side (i.e., pre-PA) and output side (i.e., post-PA) of the analog PA 220. That is, the transfer function of the transmit chain 202 and the receive chain 204 is assumed to be linear at the low transmit-power mode. To this end, the linear transfer function is captured and trained as coefficients of the compensation filter 208. Optionally, that training may be performed by transmitting a data packet of the reference transmit signal through the PA 220 while it is shut-down.

The comparison of the loopback signal 236 and the reference transmit signal 230 may be performed by capturing data sequences into memory and reusing the device's 102 Fast Fourier Transform (FFT) engine to calculate a frequency response by dividing the FFT output of a first reference transmit signal data sequence by a FFT output of a second reference transmit signal data sequence. A smoothing operation is then applied to the divided signal, which is the estimated channel frequency response. The divided signal may then be transformed back to the time domain using an inverse FFT (iFFT) or FFT engine, and then the coefficients of the compensation filter 208 may be formed by multiplying by a configurable window.

Thereafter, the PAPD analyzer 210 compares the loopback baseband signal of the loopback signal 236 with the baseband signal of the reference transmit signal that passed through the compensation filter 208. Based on this comparison that is read by the firmware, the firmware generates the control signal 238 to set up the PAPD LUT 212 for pre-distortion correction of subsequent data packets to be transmitted.

At another time instant, the synchronization block 304—which may be a part of the PAPD analyzer 210—may measure and correct the instantaneous changes of phase, gain, and/or delay between data packets of the reference transmit signal (i.e., Tx signal 318 in FIG. 3) and the loopback signal 236. For example, a possible temperature change may generate a change in phase and/or gain of the data packets of the reference transmit signal or input signal 230. In another example, a possible digital sync First-In- First-Out (sync-FIFO) may generate differences in instantaneous delay of the data packets. Although the impairments in both examples are relatively small, they are treated herein as significant with regard to non-linearity measurements by the PAPD analyzer 210. As such, the matching of the phase, gain, and/or delay between data packets of the reference transmit signal 230 and the loopback signal 236 are implemented prior to the measurement of non-linearity through the PAPD analyzer 210.

The PAPD LUT 212 may be disposed prior to the transmit chain 202. Furthermore, the PAPD LUT 212 may be configured to perform non-linear pre-distortion corrections on the subsequent data packet transmissions. For example, on the subsequent transmission of particular data packets, the parameters of the PAPD LUT 212 may transform the particular data packets into a desired output such as an output signal 232 less the non-linearity as previously measured through the PAPD analyzer 210.

In other implementations, the compensation filter 208 may be further configured to act as an echo canceller to the input signal 230 that may leak into the loopback signal 236. That is, prior to the emulation by the compensation filter 208 and the correction of the instantaneous changes in gain, phase and delay by the synchronization block 304, the signal leakage may occur as well. As such, the initial configuration of the compensation filter 208 may include echo cancellation.

Figure 3:
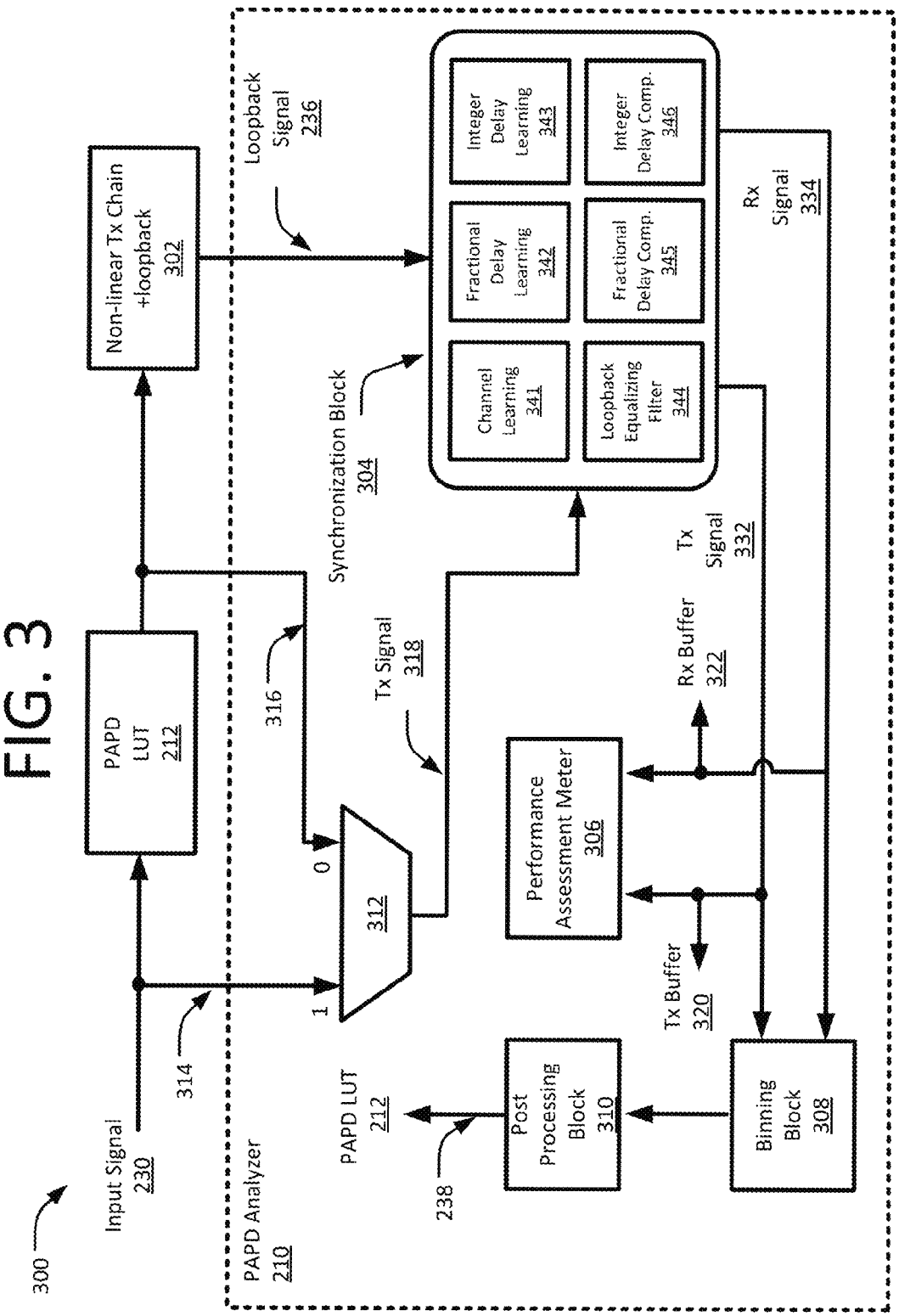
FIG. 3 illustrates a schematic diagram of a system configured to measure and correct non-linearity in accordance with an aspect of the disclosure.

FIG. 3 is a schematic diagram of a system 300 configured to measure and correct non-linearity in accordance with an aspect of the disclosure.

As shown, there is an input signal 230, the PAPD LUT 212, a non-linear block 302 that may represent the transmit chain 202 and receive chain 204 during pre-distortion correction, and the PAPD analyzer of FIG. 2. The PAPD analyzer 210 comprises a synchronization block 304, a performance assessment meter 306, a binning block 308, a post-processing block 310, and a multiplexer (MUX) 312. The synchronization block 304 comprises a channel learning 341, integer delay learning 343, fractional delay learning 342, a loopback equalizing filter 344 which is the compensation filter 208, fractional delay compensator 345 that may be implemented by a variable rate converter (VRC), and an integer delay compensator 346. The integer delay compensator 346 may be implemented as a tap delay line.

Furthermore, the MUX 312 is configured to select between a pre-PAPD LUT signal 314 or a post-PAPD LUT signal 316. Furthermore still, there is a transmit (Tx) signal 318, which is representative of the reference transmit signal, the loopback signal 236, a transmit buffer 320, and a receive buffer 322.

As described herein, the loopback equalizing filter 344 may emulate the linear transfer function at the transmit and receive side at low transmit-power mode as discussed above, and the training of coefficients of the loopback equalizing filter 344 is implemented online using real packets at the end-user. With this emulation, the synchronization block 304 is configured to ensure that the Tx signal 318 (i.e., reference transmit signal) is matched to the loopback signal 236 without differences in gain, phase, and/or delay. This synchronization activity may be performed iteratively, such as twice. That is, after impairments are corrected, the impairments are measured and corrected again to achieve better performance, and subsequently apply a binning or the EVM measurement, for example.

Thereafter, the binning block 308 may collect corrected signals from the synchronization block 304 and generate an input-output curve where the Tx signal 318 may be the input (signal) while the loopback signal 236 may be the output (signal). For example, if the post-PAPD LUT signal 316 is collected by the binning block 308 as the input, then the input-output curve may reflect non-linear portions of the loopback signal 236. The post-PAPD LUT signal 316 may include the input signal 230 that undergoes pre-distortion correction through the PAPD LUT 212 while the pre-PAPD LUT signal 314 may include the input signal 230 without pre-distortion correction by the PAPD LUT 212.

With continuing reference to FIG. 3, the binning block 308 is configured to generate an input-output nonlinearity curve. The post-processing block 310 is configured to invert the nonlinearity curve, that is, calculate the pre-distortion correction for the PAPD LUT 212.

The performance assessment meter 306 may be an Error Vector Magnitude (EVM) meter, a mask meter and/or an Adjacent Channel Leakage Ratio (ACLR) meter or out-of-band emission meter. The EVM is measured based on a comparison of two output signals 332 and 334 from the synchronization block 304, that is, Tx signal 332 associated with Tx signal 318 and receive (Rx) signal 334 associated with loopback signal 236. The EVM measurement may then be used to verify that the input signal is still high quality, retrigger the closed loop PAPD flow, or lower the transmit power so that the EVM is improved.

At the synchronization block 304, the channel learning 341 is configured to capture the linear portions of the transmit chain 202 and the receive chain 204 and thereafter, the coefficients of the FIR filter, which is represented by the loopback equalizing filter 344, are adjusted to match the captured linear transfer function. Furthermore, the channel learning 341 may facilitate measurement and correction of instantaneous changes in the phase and/or gain of the data packets of the Tx signal 318.

In order to maintain size of the FIR filter, the integer delay learning 343 and the integer delay compensator 346 are implemented to emulate a large delay, for example, of the Tx signal 318 compared with the loopback signal 236. The estimated large delay is digitally placed so that the size of the FIR filter need not be increased and thus, a shorter FIR filter may be used. On the other hand, the fractional delay learning 342 and the fractional delay compensator 345 may be implemented to correct for small delays due to FIFO feature of transmitting data packets. The fractional delay is also applied during the channel learning. If the FIR filter is well located in the time domain, the FIR filter's length may be significantly shorter than trying to capture the fractional delay by the FIR filter itself. Therefore, there is compensation for integer delay and fractional delay at the same (low-power) packet used to train the compensation filter 208, and then in a next (high-power) packet, because of the sync-FIFO feature the fractional delay is compensated again. This synchronization correction before training is optional but recommended to reduce cost.

The transmission signal quality assessment, by comparing the loopback signal 236 to with the reference transmit signal for measuring parameters such as EVM, ACLR and mask, rely on the visibility of the transmission signal with the elimination of the linear and delay distortions. Based on signal quality assessment, the system 200 may choose to react, for example, by lowering transmit power, adjusting other parameters, and/or re-calibrating.

Figure 4:
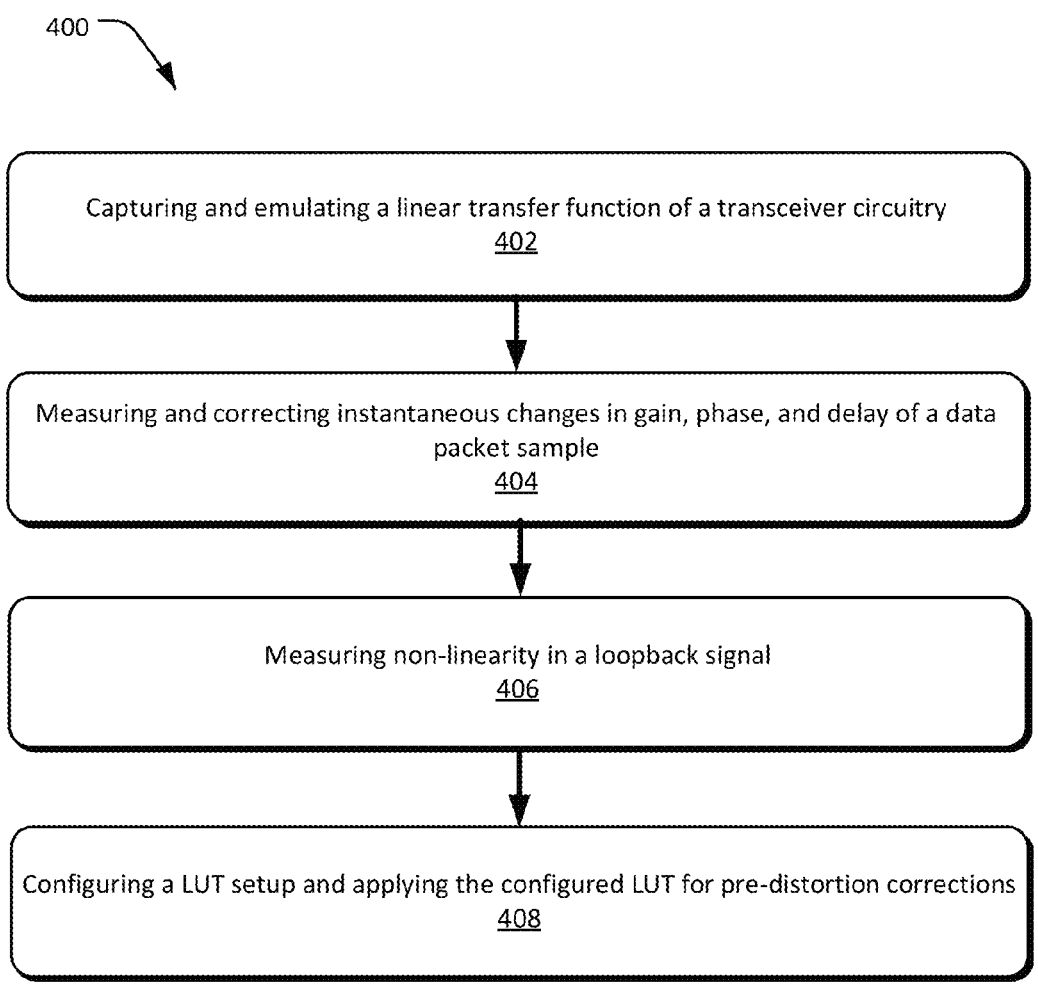
FIG. 4 illustrates a flowchart of a process for implementing a closed-loop system for measuring and compensating non-linearity in a device in accordance with an aspect of the disclosure.

FIG. 4 illustrates a flowchart 400 of a method for implementing a closed-loop system for measuring and compensating non-linearity in a transceiver circuitry of a device in accordance with an aspect of the disclosure. The order in which the method is described is not intended to be construed as limiting, and any number of the described method blocks may be combined in any order to implement the method, or an alternative method. Additionally, individual blocks may be deleted from the method without departing from the spirit and scope of the subject matter described herein. Furthermore, the method may be implemented in any suitable hardware, software, firmware, or a combination thereof, without departing from the scope of the disclosure.

At block 402, estimating a linear transfer function of a transceiver circuitry to set coefficients of the compensation filter 208 is performed. For example, a reference transmit signal or input signal 230 is transmitted at low transmit-power mode through a firmware power adjustment at the input signal 230 side; or through a power gain-adjustment of the TX chain 202. In this example, the linear transfer function of the transmit chain 202 and the receive chain 204 is emulated. More specifically, coefficients of the compensation filter 208 are trained to match linear portions at an input side (i.e., pre-PA) and output side (i.e., post-PA) of the analog PA 220.

In other implementations, the compensation filter 208 is configured to act as an echo canceller for the input signal 230 that may leak into the receive chain 204, and into the loopback signal 236. In this other implementation, the echo cancellation is implemented prior to the emulating of the linear transfer function of the transceiver circuitry.

At block 404, measuring and correcting instantaneous changes on a data packet of a reference transmit signal is performed. For example, the synchronization block 304 measures and corrects the instantaneous difference or changes in the gain, phase, and/or delay of a particular data packets. In this example, the first few data packets are used by the synchronization block 304 to measure and correct the instantaneous changes of the gain, phase, and/or delay.

At block 406, non-linearity of the loopback signal 236 is measured. The nonlinearity may be determined by the binning block 308 comparing the Tx signal 332 and Rx signal 334 from the synchronization block 304 and generating the input-output nonlinearity curve.

At block 408, the PAPD LUT 212 is configured for pre-distortion corrections on subsequent data packet transmission based upon the comparison between the loopback signal 236 and the reference transmit signal. For example, the firmware reads the non-linearity from the measurements made by the PAPD analyzer 210 and based from this non-linearity, firmware facilitates the setting up of the PAPD LUT 212 to be applied to subsequent data packets to be transmitted. In this example, the PAPD LUT 212 is configured to perform pre-distortion correction of the transmit chain 202 and in particular the analog PA 220.

In other implementations, the PAPD analyzer 210 generates a control signal 238 that is received and used by the PAPD LUT 212 for pre-distortion correction of the transceiver circuitry.

Example 1 is a method of performing pre-distortion calibration in a transceiver of a device, the method comprising: estimating a linear transfer function of a loopback signal to set coefficients of a compensation filter; filtering, by the compensation filter, a digital transmit signal; comparing, by a Power Amplifier Pre-Distortion (PAPD) analyzer, the loopback signal with the filtered digital transmit signal; and configuring a PAPD Look-Up Table (LUT) based on the comparison, wherein the PAPD LUT is for implementing pre-distortion correction of subsequent data packets to be transmitted.

In Example 2, the subject matter of Example 1, further comprising: synchronizing, before the estimating, by a synchronization block, the digital transmit signal and the loopback signal for at least one of gain, phase, and delay changes in data packets of the loopback signal.

In Example 3, the subject matter of Example 1, further comprising: synchronizing, after the filtering, by a synchronization block, the digital transmit signal and the loopback signal for at least one of gain, phase, and delay changes in data packets of the loopback signal.

In Example 4, the subject matter of Example 3, wherein the estimating and the synchronizing occur at different time instants.

In Example 5, the subject matter of Example 3, wherein the estimating and the synchronizing occur at a same data packet time.

In Example 6, the subject matter of Example 1, further comprising: training the coefficients of the compensation filter to match a linear portion at an input side of a power amplifier (PA), which is coupled between the PAPD LUT and the PAPD analyzer, and a linear portion at an output side of the PA.

In Example 7, the subject matter of Example 1, wherein the training is performed while the PA is not operating.

In Example 8, the subject matter of Example 1, wherein the estimating of the linear transfer function is performed during a low-transmit power mode.

In Example 9, the subject matter of Example 1, further comprising: performing any of the estimating, filtering, comparing, and configuring iteratively.

In Example 10, the subject matter of Example 1, wherein the compensation filter is configured to act as an echo canceller during the estimation of the linear transfer function.

In Example 11, the subject matter of Example 1, further comprising: downconverting, by a baseband filter, the loopback signal to a baseband loopback signal, wherein the comparing comprises comparing the baseband loopback signal with the filtered digital transmit signal.

In Example 12, the subject matter of Example 1, further comprising: generating a control signal based on the comparison; and configuring the PAPD LUT based on the control signal.

Example 13 is a method for evaluating transmit performance of a transceiver of a device, the method comprising: receiving, by a synchronization block, a Power Amplifier (PA) output signal via a loopback and a filtered transmit signal; correcting, by the synchronization block, data of the filtered transmit signal for phase, gain and/or delay, wherein the filtered transmit signal is filtered by a compensation filter; and assessing, by a performance assessor, transmit performance of the corrected, filtered transmit signal, wherein the transmit performance is used to control a parameter of subsequent data to be transmitted.

In Example 14, the subject matter of Example 13, wherein the performance assessor comprises at least one of an Error Vector Magnitude (EVM) meter, a mask meter, and an Adjacent Channel Leakage Ratio (ACLR) meter.

In Example 15, the subject matter of Example 13, wherein the controlled parameter is transmit power.

In Example 16, the subject matter of Example 13, wherein the controlled parameter is an offset in pre-distortion look-up table entries.

Example 17 is a device, comprising: a compensation filter configured to filter a digital transmit signal, wherein a Fast Fourier Transform (FFT) engine is configured to estimate a linear transfer function of a loopback signal to set coefficients of the compensation filter; a Power Amplifier Pre-Distortion (PAPD) analyzer coupled to the compensation filter and configured to compare the loopback signal with the filtered digital transmit signal; and a PAPD Look-Up Table (LUT) configured based on the comparison, wherein the PAPD LUT is for implementing pre-distortion correction of subsequent data packets to be transmitted.

In Example 18, the subject matter of Example 17, further comprising: a synchronization block configured to, before the estimating, synchronize the digital transmit signal and the loopback signal for at least one of gain, phase, and delay changes in data packets of the loopback signal.

In Example 19, the subject matter of Example 17, further comprising: a synchronization block configured to, after the filtering, synchronize the digital transmit signal and the loopback signal for at least one of gain, phase, and delay changes in data packets of the loopback signal.

In Example 20, the subject matter of Example 19, wherein the PAPD analyzer comprises: a binning block configured to generate an input-output curve based on the synchronized signals, a post-processing block is configured to generate a control signal based on a non-linearity derived from the input-output curve, wherein the PAPD LUT is configured based on the control signal.

In Example 21, the subject matter of Example 19, wherein the synchronization block is further configured to emulate and/or correct gain, phase, and/or delay.

In Example 22, the subject matter of Example 17, wherein the compensation filter is a Finite Impulse Response (FIR) filter, and the coefficients comprise complex coefficients.

In Example 23, the subject matter of Example 17, wherein the PAPD analyzer comprises: a post processing block configured to generate a control signal based on the comparison, wherein the PAPD LUT is configured based on the control signal.

In Example 24, the subject matter of Example 17, wherein the FFT engine is configured to estimate the linear transfer function during a low transmit-power mode.

In Example 25, the subject matter of Example 17, further comprising: a transmit chain comprising a digital-to-analog converter and an analog Power Amplifier (PA), and configured to receive the transmit signal; a loopback receive chain coupled to an output of the PA, and comprising an analog-to-digital converter; wherein the PAPD analyzer is coupled to an output of the loopback receive chain, and the compensation filter is digital and coupled between the PAPD analyzer and the transmit chain, and wherein the synchronization block is configurable to correct instantaneous changes in data of a specific transmit signal prior to comparing the loopback signal with the specific transmit signal.

Example 26 is a device, comprising: a compensation filter means for filtering a digital transmit signal, wherein a Fast Fourier Transform (FFT) engine means is for estimating a linear transfer function of a loopback signal to set coefficients of the compensation filter means; a Power Amplifier Pre-Distortion (PAPD) analyzing means coupled to the compensation filter and for comparing the loopback signal with the filtered digital transmit signal; and a PAPD Look-Up Table (LUT) means configured based on the comparison, wherein the PAPD LUT means is for implementing pre-distortion correction of subsequent data packets to be transmitted.

In Example 27, the subject matter of Example 26, further comprising: a synchronization means for, before the estimating, synchronizing the digital transmit signal and the loopback signal for at least one of gain, phase, and delay changes in data packets of the loopback signal.

In Example 28, the subject matter of Example 26, further comprising: a synchronization means for, after the filtering, synchronizing the digital transmit signal and the loopback signal for at least one of gain, phase, and delay changes in data packets of the loopback signal.

In Example 29, the subject matter of Example 28, wherein the PAPD analyzing means comprises: a binning means for generating an input-output curve based on the synchronized signals, a post-processing means for generating a control signal based on a non-linearity derived from the input-output curve, wherein the PAPD LUT means is configured based on the control signal.

In Example 30, the subject matter of Example 28, wherein the synchronization means is further for emulating and/or correct gain, phase, and/or delay.

In Example 31, the subject matter of Example 26, wherein the compensation filter means is a Finite Impulse Response (FIR) filter, and the coefficients comprise complex coefficients.

In Example 32, the subject matter of Example 26, wherein the PAPD analyzing means comprises: a post processing means for generating a control signal based on the comparison, wherein the PAPD LUT means is configured based on the control signal.

In Example 33, the subject matter of Example 26, wherein the FFT engine is for estimating the linear transfer function during a low transmit-power mode.

In Example 34, the subject matter of Example 26, further comprising: a transmit chain comprising a digital-to-analog converting means and an analog Power Amplifier (PA), and configured to receive the transmit signal; a loopback receive chain coupled to an output of the PA, and comprising an analog-to-digital converting means; wherein the PAPD analyzing means is coupled to an output of the loopback receive chain, and the compensation filter means is digital and coupled between the PAPD analyzing means and the transmit chain, and wherein the synchronization means is configurable to correct instantaneous changes in data of a specific transmit signal prior to comparing the loopback signal with the specific transmit signal.

Example 36 is an apparatus as substantially shown and described.

Example 37 is a method as substantially shown and described.

While the foregoing has been described in conjunction with exemplary aspect, it is understood that the term "exemplary" is merely meant as an example, rather than the best or optimal. Accordingly, the disclosure is intended to cover alternatives, modifications and equivalents, which may be included within the scope of the disclosure.

Although specific aspects have been illustrated and described herein, it will be appreciated by those of ordinary skill in the art that a variety of alternate and/or equivalent implementations may be substituted for the specific aspects shown and described without departing from the scope of the present application. This application is intended to cover any adaptations or variations of the specific aspects discussed herein.

What is claimed is:

1. A method of performing pre-distortion calibration in a transceiver of a device, the method comprising:
   estimating a linear transfer function of a loopback signal to set coefficients of a compensation filter,
   filtering, by the compensation filter, a digital transmit signal, wherein the compensation filter is configured to act as an echo canceller during the estimation of the linear transfer function;

comparing, by a Power Amplifier Pre-Distortion (PAPD) analyzer, the loopback signal with the filtered digital transmit signal; and configuring a PAPD Look-Up Table (LUT) based on the comparison, wherein the PAPD LUT is for implementing pre-distortion correction of subsequent data packets to be transmitted.

2. The method of claim 1, further comprising:
synchronizing, before the estimating, by a synchronization block, the digital transmit signal and the loopback signal for at least one of gain, phase, and delay changes in data packets of the loopback signal.

3. The method of claim 1, further comprising:
synchronizing, after the filtering, by a synchronization block, the digital transmit signal and the loopback signal for at least one of gain, phase, and delay changes in data packets of the loopback signal.

4. The method as recited in claim 3, wherein the estimating and the synchronizing occur at different time instants.

5. The method as recited in claim 3, wherein the estimating and the synchronizing occur at a same data packet time.

6. The method as recited in claim 1, further comprising:
training the coefficients of the compensation filter to match a linear portion at an input side of a power amplifier (PA), which is coupled between the PAPD LUT and the PAPD analyzer, and a linear portion at an output side of the PA.

7. The method as recited in claim 1, wherein the training is performed while the PA is not operating.

8. The method as recited in claim 1, wherein the estimating of the linear transfer function is performed during a low-transmit power mode.

9. The method as recited in claim 1, further comprising:
performing any of the estimating, filtering, comparing, and configuring iteratively.

10. The method as recited in claim 1, further comprising:
downconverting, by a baseband filter, the loopback signal to a baseband loopback signal,
wherein the comparing comprises comparing the baseband loopback signal with the filtered digital transmit signal.

11. The method as recited in claim 1, further comprising:
generating a control signal based on the comparison; and
configuring the PAPD LUT based on the control signal.

12. A method for evaluating transmit performance of a transceiver of a device, the method comprising:
receiving, by a synchronization block, a Power Amplifier (PA) output signal via a loopback and a filtered transmit signal;
correcting, by the synchronization block, data of the filtered transmit signal for at least one of phase, gain and delay, wherein the filtered transmit signal is filtered by a compensation filter, and
assessing, by a performance assessor, transmit performance of the corrected, filtered transmit signal, wherein the performance assessor comprises at least one of an Error Vector Magnitude (EVM) meter, a mask meter, and an Adjacent Channel Leakage Ratio (ACLR) meter,
wherein the transmit performance is used to control a parameter of subsequent data to be transmitted.

13. The method as recited in claim 12, wherein the controlled parameter is transmit power.

14. A method for evaluating transmit performance of a transceiver of a device, the method comprising:

receiving, by a synchronization block, a Power Amplifier (PA) output signal via a loopback and a filtered transmit signal;
correcting, by the synchronization block, data of the filtered transmit signal for at least one of phase, gain and delay, wherein the filtered transmit signal is filtered by a compensation filter; and
assessing, by a performance assessor, transmit performance of the corrected, filtered transmit signal, the transmit performance being used to control a parameter of subsequent data to be transmitted,
wherein the controlled parameter is an offset in pre-distortion look-up table entries.

15. A device, comprising:
a compensation filter configured to filter a digital transmit signal, wherein a Fast Fourier Transform (FFT) engine is configured to estimate a linear transfer function of a loopback signal to set coefficients of the compensation filter,
a Power Amplifier Pre-Distortion (PAPD) analyzer coupled to the compensation filter and configured to compare the loopback signal with the filtered digital transmit signal; and
a PAPD Look-Up Table (LUT) configured based on the comparison, wherein the PAPD LUT is for implementing pre-distortion correction of subsequent data packets to be transmitted.

16. The device of claim 15, further comprising:
a synchronization block configured to, before the estimating, synchronize the digital transmit signal and the loopback signal for at least one of gain, phase, and delay changes in data packets of the loopback signal.

17. The device of claim 15, further comprising:
a synchronization block configured to, after the filtering, synchronize the digital transmit signal and the loopback signal for at least one of gain, phase, and delay changes in data packets of the loopback signal.

18. The device as recited in claim 17, wherein the PAPD analyzer comprises:
a binning block configured to generate an input-output curve based on the synchronized signals,
a post-processing block is configured to generate a control signal based on a non-linearity derived from the input-output curve,
wherein the PAPD LUT is configured based on the control signal.

19. The device as recited in claim 17, wherein the synchronization block is further configured to emulate and/or correct gain, phase, and/or delay.

20. The device as recited in claim 15, wherein the compensation filter is a Finite Impulse Response (FIR) filter, and the coefficients comprise complex coefficients.

21. The device as recited in claim 15, wherein the PAPD analyzer comprises:
a post processing block configured to generate a control signal based on the comparison,
wherein the PAPD LUT is configured based on the control signal.

22. The device as recited in claim 15, wherein the FFT engine is configured to estimate the linear transfer function during a low transmit-power mode.

23. A device as recited in claim 15, further comprising:
a transmit chain comprising a digital-to-analog converter and an analog Power Amplifier (PA), and configured to receive the transmit signal;
a loopback receive chain coupled to an output of the PA, and comprising an analog-to-digital converter, wherein the PAPD analyzer is coupled to an output of the loopback receive chain, and a compensation filter is digital and coupled between a PAPD analyzer and the transmit chain, and wherein a synchronization block is configurable to correct instantaneous changes in data of a specific transmit signal prior to comparing the loopback signal with the specific transmit signal.

* * * * *